United States Patent [19]

Wen et al.

[11] Patent Number: 5,546,049

[45] Date of Patent: Aug. 13, 1996

[54] FREQUENCY SCALABLE PRE-MATCHED TRANSISTOR

[75] Inventors: Cheng P. Wen, Mission Viejo; Cheng-Keng Pao, Torrance, both of Calif.

[73] Assignee: Hughes Aircraft Company, Los Angeles, Calif.

[21] Appl. No.: 414,829

[22] Filed: Mar. 31, 1995

[51] Int. Cl.$^6$ ........................................ H03F 3/193
[52] U.S. Cl. ................................ 330/277; 330/286
[58] Field of Search ............................ 330/277, 286, 330/307; 333/33

[56] References Cited

U.S. PATENT DOCUMENTS

| | | | |
|---|---|---|---|
| 4,587,541 | 5/1986 | Dalman et al. | 330/277 X |
| 5,233,313 | 8/1993 | Kohno et al. | 330/277 |
| 5,412,347 | 5/1995 | Minnis | 330/286 |

*Primary Examiner*—James B. Mullins
*Attorney, Agent, or Firm*—M. E. Lachman; M. W. Sales; W. K. Denson-Low

[57] ABSTRACT

A relatively high power active gain device, such as MESFET or similar transistor, has distributed impedance characteristics at relatively high RF (microwave) frequencies of operation due to physical device size limitations. A transmission line segment (104) is placed in relatively close spacial relationship and is coupled in parallel electrical relationship with the input port (162) of the high power active device. This provides for highly simplified design of an impedance prematched amplifier (100) over a relatively broad range of predetermined input signal center frequencies. An active device (102) is provided based on power requirements and is characterized over a range of center frequencies and device sizes independently from the characterization of the transmission line segment (104) over a range of center frequencies and segment lengths, since the impedance characteristics of the active device (102) and the transmission line (104) are not dependent upon each other. Based on a predetermined operating center frequency and on the input source impedance characteristics, an appropriate pre-characterized transmission line segment (104) is paired with an appropriate pre-characterized active device (102) based on a simplified model for the prematched amplifier (100). Characterization procedures are therefore simplified and relatively inexpensive. The design cycle for a prematched amplifier is considerably simplified, shortened, and reduced in cost.

13 Claims, 3 Drawing Sheets

FIG. 1
PRIOR ART
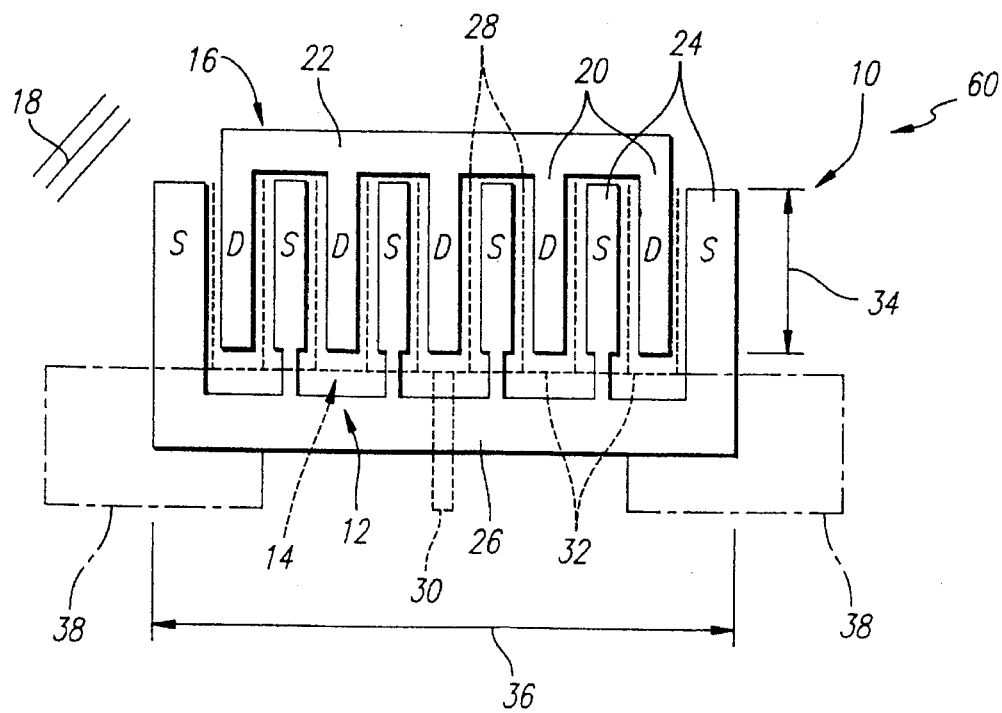
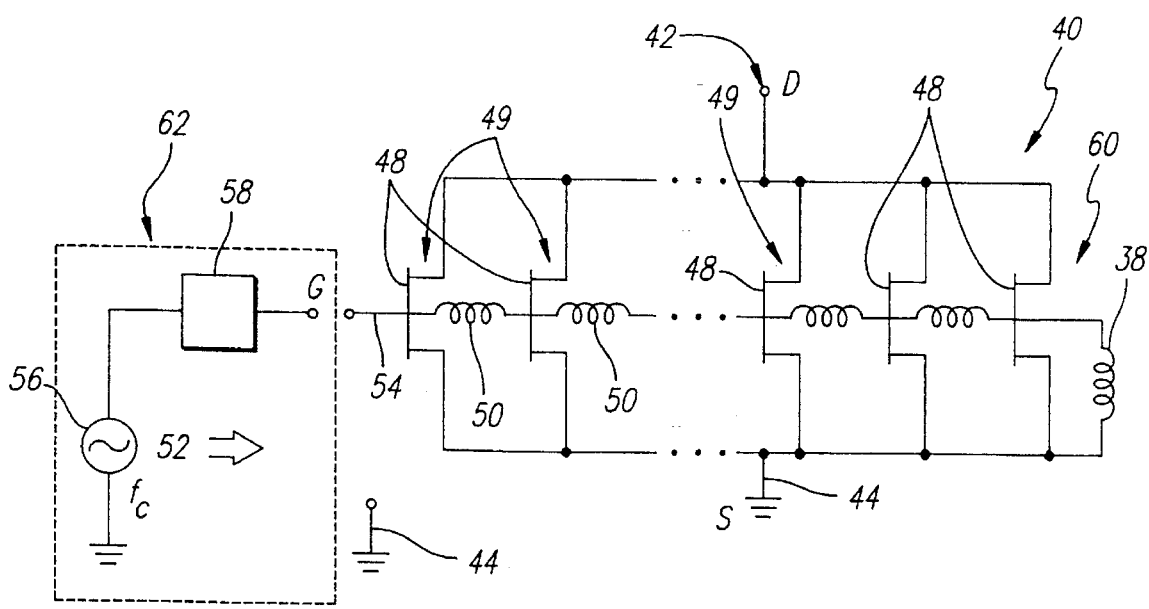
FIG. 2   PRIOR ART

FREQUENCY SCALABLE PRE-MATCHED TRANSISTOR

BACKGROUND OF THE INVENTION

1. Field of Invention

The present invention relates to impedance matching elements for active gain devices and, in particular, to a frequency scalable prematch microwave amplifier with independently characterized active cell and impedance matching elements assembled to optimize input signal power transfer.

2. Description of the Related Art

In the expanding era of high frequency communications applications, such as microwave (RF) amplifiers for satellite communications, matching a high power, low impedance amplifier device to a typical RF input source in order to obtain optimal power transfer is a time consuming and costly procedure. Such impedance matching, or prematching of the amplifier to the source is desirable to provide a broad bandwidth, high power, high gain microwave amplifier.

At high power requirements and high operating frequencies, presently existing microwave amplifiers employ active gain devices such as metal electrode semiconductor field effect transistors (MESFETs), high electron mobility transistors (HEMTs), or bipolar junction transistors to amplify an input signal. In order to match the impedance of the active gain device to the impedance of the input signal at the operating frequency, a passive matching element having a particular impedance value at the operating frequency is usually coupled to the active gain device. For existing amplifiers operating at a relatively high frequency and capable of handling high power requirements, the prematch design procedure is time consuming and costly, increasing the time to market and the overall amplifier cost.

FIG. 1 illustrates an example of a conventional, prior art monolithic microwave integrated circuit (MMIC) metal electrode semiconductor field effect transistor (MESFET) 10 for use in relatively high power, high frequency amplifier applications, such as microwave (RF) communications. The prior art MESFET 10 ordinarily comprises a source electrode 12, a distributed gate electrode 14, and a distributed drain electrode 16, disposed adjacent a semiconductor substrate 18. The gate electrode 14 is shown in dashed lines to indicate that it is provided on a different plane than the drain electrode 16 and the source electrode 12. The substrate 18 is disposed between the source/drain electrode plane and the gate electrode plane, providing a conventional microstrip structure.

The electrode structures of prior art MESFET 10 are illustrated in FIG. 3 only with respect to the metal electrode layers providing connections to respective active distributed semiconductor structures (not shown) within the substrate 18. Accordingly, the prior art MESFET 10, in conventional fashion, is formed in a semiconductor substrate 18 and includes active source, gate, and drain regions (not shown) therein corresponding respectively to the distributed source 12, drain 16, and gate 14 electrodes illustrated in FIG. 3.

More particularly, the distributed drain electrode 16 comprises a plurality of rectangular drain fingers 20 electrically connected by a common drain portion 22. Similarly, the compound source electrode 12 comprises a plurality of rectangular source fingers 24 electrically connected by a common source portion 26. Compound gate electrode 14 comprises a plurality of gate fingers 28 electrically connected to a gate input terminal 30 by a plurality of gate feed connections 32.

The respective drain fingers 20 are each disposed between two adjacent source fingers 24, typically in the same metal layer. The respective drain fingers 20 and source fingers 24 are disposed at a predetermined distance apart. A respective gate finger 28 is disposed substantially in the center between each adjacent source finger 24 and drain finger 20, typically in a different metal layer than that of the drain electrode 16 and the source electrode 12. Hence, the gate electrode 14, drain electrode 16, and source electrode 12 are typically not arranged in a coplanar fashion for a prior art MESFET 10. A width 34 of the prior art MESFET 10 is determined by the length of the source fingers 24.

A length 36 of the prior art MESFET 10 depends, among other factors, on the number of fingers utilized in the distributed device structures. Generally, if the power handling capabilities of the prior art MESFET 10 are to be increased, the number of fingers in each of the source, drain and gate structures is respectively increased which also increases the length 36 of the device.

As the number of fingers in the respective distributed device structures is increased, the impedance of the prior art MESFET 10 adversely decreases. For example, the transistor input impedance can be as low as approximately 1 ohm for multi-watt, high power devices having many gate fingers 28, source fingers 24 and drain fingers 20. In order to compensate for the reduced impedance, an inductor 38 (shown in broken lines) is commonly connected between the source electrode 12 and the far ends of the outermost gate feeds 32, at the edges of the transistor length 36. The inductor 38 is illustrated in broken lines since it connects the gate electrode 14 in a first plane to the source electrode 12 in a second plane, typically through holes (not shown) provided in the semiconductor substrate 18. Providing holes in the substrate 18 typically adds to the cost and complexity of manufacturing and designing a prior art prematch amplifier.

The foregoing arrangement provides a parallel inductance between the gate electrode 14 and the source electrode 12. Source electrode 12 ordinarily acts as the reference or ground node. The parallel inductor 38 is provided having a precharacterized or predetermined inductance value. The prior art MESFET 10 is thereby "prematched" to a predetermined input signal impedance, such as 50 ohms, for a given center frequency or operating frequency. However, the relative cost and effectiveness of "prematching" the prior art MESFET 10 using inductor 38 varies considerably with the frequency of operation, or center frequency, of the signal being applied to the gate input 30 (i.e., the input signal). Therefore, matching a low RF impedance amplifier device, such as the prior art MESFET 10, to a typical 50 ohm input impedance source for a broad bandwidth, high gain microwave amplifier application is a major challenge to circuit designers.

At relatively low center frequencies the physical dimensions of the prior art MESFET 10 are considerably smaller than the wavelength of the input signal to the prematched amplifier. The MESFET 10 and the inductor 38 both act as "lumped" parameter elements at sufficiently low center frequency values. This results in a relatively simple equivalent circuit model for the prior art MESFET 10 at sufficiently low frequencies, and consequently results in a relatively simple impedance prematch design procedure.

For sufficiently low center frequencies, a low frequency equivalent circuit model (not shown) applies. The input impedance of the active gain device, such as a HEMT, bipolar transistor, or the prior art MESFET 10, is generally capacitive. The input impedance is modeled as a "lumped" capacitor connected between the gate 14 and the source 12 of the prior art MESFET 10. The lumped capacitor has a gate-source capacitance ($C_{GS}$). At such low frequencies, the inductor 38, or matching element, is also modeled as a single lumped parameter inductive element ($L_M$). The inductor 38 is placed in parallel with the input gate-source capacitor in the low frequency equivalent model. The resonant frequency $\omega_r$ of the parallel coupling of the gate-source capacitor and the inductor 38 is inversely proportional to the square-root of the product of the capacitance multiplied by the inductance:

$$\omega_r = \frac{1}{\sqrt{L_M * C_{GS}}}.$$

The amplifier is prematched by varying the inductance value $L_M$ of the inductor 38 to adjust the value of the resonant frequency $\omega_r$.

Hence, once the impedance properties of the prior art MESFET 10 are characterized over a range of relatively low center frequencies, the center frequency, operating frequency, or resonant frequency ($\omega_r$) can be changed, or frequency scaled, by simply changing the inductance value $L_M$ of the parallel inductor 38. The low frequency equivalent circuit will accurately model, or predict, the modified prematched MESFET 10 amplifier. A key aspect to the simplicity of the low frequency prematch procedure is that the inductance 38 is coupled across the input terminals to the MESFET 10 in the low frequency equivalent circuit (not shown), and the inductance 38 is characterized over a range of frequencies independently from the MESFET 10. However, at relatively high frequencies, such as in the microwave (RF) range of operation, the equivalent circuit model becomes much more complex and the amplifier becomes much more difficult to characterize and prematch properly.

As illustrated in FIG. 2, a more accurate high frequency equivalent circuit model 40 of prior art MESFET 10 must account for the "distributed", rather than lumped, transistor parameters stemming from the finite size of the prior art MESFET 10. At relatively high center frequencies, the physical dimensions of the prior art MESFET 10 approach are considerably larger than the wavelength (not shown) of the input signal 52 to the amplifier 60. The MESFET 10 therefore acts as a "distributed" parameter device at sufficiently high center frequency values. The relatively complex high frequency equivalent circuit model 40 for the prior art MESFET 10 consequently results in a relatively expensive and complicated amplifier prematch design procedure.

The high frequency equivalent circuit 40 of prior art MESFET 10 is represented by a plurality of small "lumped" FETS 48 connected by a plurality of lumped gate inductors 50. Hence, the high frequency equivalent circuit 40 includes a plurality of amplification stages 49. The lumped FET models 48 are each connected to a drain node 42 and to a source reference node 44 at respective source and drain leads. The gate inductors 50 couples each successive stage 49 in the equivalent circuit. More significantly, the matching element, or inductor 38 is modeled in parallel with the gate-source input terminals of the very last lumped FET model 48 at the very last stage 49 of the distributed parameter prior art MESFET 10. That is, the inductor 38 is coupled at the output stage of amplifier 60 and is thus "seen through" many lumped stages 49 by the input signal source 62.

An input signal source 62 has a series characteristic impedance element 58 connected to a signal generator 56 operating at a desired center frequency ($\omega_c$) for the particular amplifier application being designed. The inductor 38 is coupled to prior art MESFET 10 in order to attempt to match the impedance value of the amplifier 60 to approximately the same value as the input signal impedance 58 at the center frequency $\omega_c$. Such prematching of the amplifier 60 to the input signal impedance element 58 provides optimum power transfer to the amplifier 60, which is highly desirable.

The input signal impedance 58 is typically fifty (50) ohms at the center frequency $\omega_c$ of interest. However, the effect of the inductor 38, as "seen" by the input signal at lead 52 when the input source 62 is connected to an input terminal 54 of the amplifier 60, depends in a non-trivial, complex relationship on the distributed parameters in each active stage 49 of the high frequency distributed equivalent circuit model 40. Thus for high frequencies, the effect of the inductor 38 is frequency dependent and can no longer be characterized over a range of frequencies independently from the characterization of the prior art MESFET 10. Every time either the inductor 38 is changed to a different inductance value $L_M$, or the MESFET 10 is changed to a different power capability (i.e., is provided with a different length 36), the entire amplifier 60 must be characterized from scratch to check whether an adequate "prematch" has been effected at the center frequency $\omega_c$ of interest.

"Characterizing" a device or element is a non-trivial, time consuming procedure and involves determining the frequency dependent impedance and phase characteristics of the particular device or element. A test source is used to apply a controlled signal to the device or element and instrumentation is used to measure the response to the test source. The test source is applied to the input terminals of the device or element. The test source ordinarily provides a signal having a predetermined center frequency, a predetermined magnitude value, and a phase-reference value. The device or element being characterized must be measured with respect to both its magnitude response (attenuation or gain) and with respect to phase response (time-delay) to the test source signal at the predetermined center frequency.

In the case of the high frequency amplifier 60 discussed supra, the inductor 38 cannot be characterized separately from the prior art MESFET 10. A designer, in order to adequately prematch the amplifier 60, must first select a MESFET 10 having suitable power capabilities (appropriate size). The designer must next estimate an inductance value $L_M$ for inductor 38 which is to be coupled with the MESFET 10 in an attempt to prematch the characteristics of the overall amplifier 60 to the input signal source 62 at the center frequency of interest. The entire amplifier 60 is then characterized to determine whether the actual prematch is within required design tolerances. Many characterizations may be necessary to arrive at a suitable prematch, since the complexity of the equivalent circuit model requires a characterization process that is essentially empirical in nature.

Hence, for a prior art prematch amplifier 60, changing either the desired center frequency or the power capability of an amplifier 60 requires an expensive and time consuming procedure of re-characterizing the amplifier 60 to test the prematch. Accordingly, it is very difficult to provide the prior art amplifier 60 with either power or frequency scalability to a particular application. These typical difficulties adversely increase both the length of the amplifier design cycle and the relative cost of existing prematched prior art microwave amplifiers. For example, at least one additional circuit design iteration is presently required if a prematched transistor, such as prior art MESFET 10, proven for operation at one frequency band of interest (e.g., x-band) is to be operated at a different frequency band of interest (e.g., C-band). The design, wafer fabrication and test cycle for such an additional design cycle iteration extend the time to market by several months and typically increase engineering costs by tens of thousands of dollars.

Therefore, a need exists for resolving the foregoing problems and difficulties presently inherent in providing a prematched microwave amplifier which is easily scalable to operate over a broad range of relatively high power capabilities and over a broad range of relatively high center frequencies.

Accordingly, an object of the present invention is to provide a frequency scalable pre-matched transistor which resolves the foregoing problems, and provides a relatively low cost, high power, short design cycle, prematched microwave amplifier which is easily scalable to operate over a broad range of relatively high power capabilities and over a broad range of relatively high center frequencies.

SUMMARY OF THE INVENTION

In accordance with a specific illustrative embodiment of the present invention, a frequency scalable prematched amplifier includes an active gain device and a matching element. The active gain device includes an input electrode for receiving an input signal with a predetermined center frequency. The matching element includes an input end and a termination. The input end is electrically coupled to the input electrode of the active gain device to provide a signal feed region. The termination is a predetermined distance from the signal feed region with the predetermined distance being selected to optimize a power transfer of the input signal at the signal feed region.

In a further aspect of the present invention, the active gain device includes at least one source portion electrically coupled to a plurality of source feed portions to provide a distributed source electrode. The plurality of source feed portions define the matching element which includes an input end and a termination as described above.

In still a further aspect of the present invention, the plurality of source feed portions provide an input wave guide for receiving the input signal and a termination wave guide between the signal feed region and the termination.

DESCRIPTION OF THE DRAWINGS

Other objects, features and advantages of the invention will become readily apparent upon reference to the following detailed description when considered in conjunction with the accompanying drawings, in which like referenced numerals designate like parts throughout the figures thereof, and wherein:

FIG. 1 shows a conventional monolithic microwave integrated circuit transistor for use in relatively high power, high frequency amplifier applications;

FIG. 2 shows a high frequency equivalent circuit model of the transistor of FIG. 1;

DETAILED DESCRIPTION OF THE PREFERRED EMBODIMENTS

Figure 3:
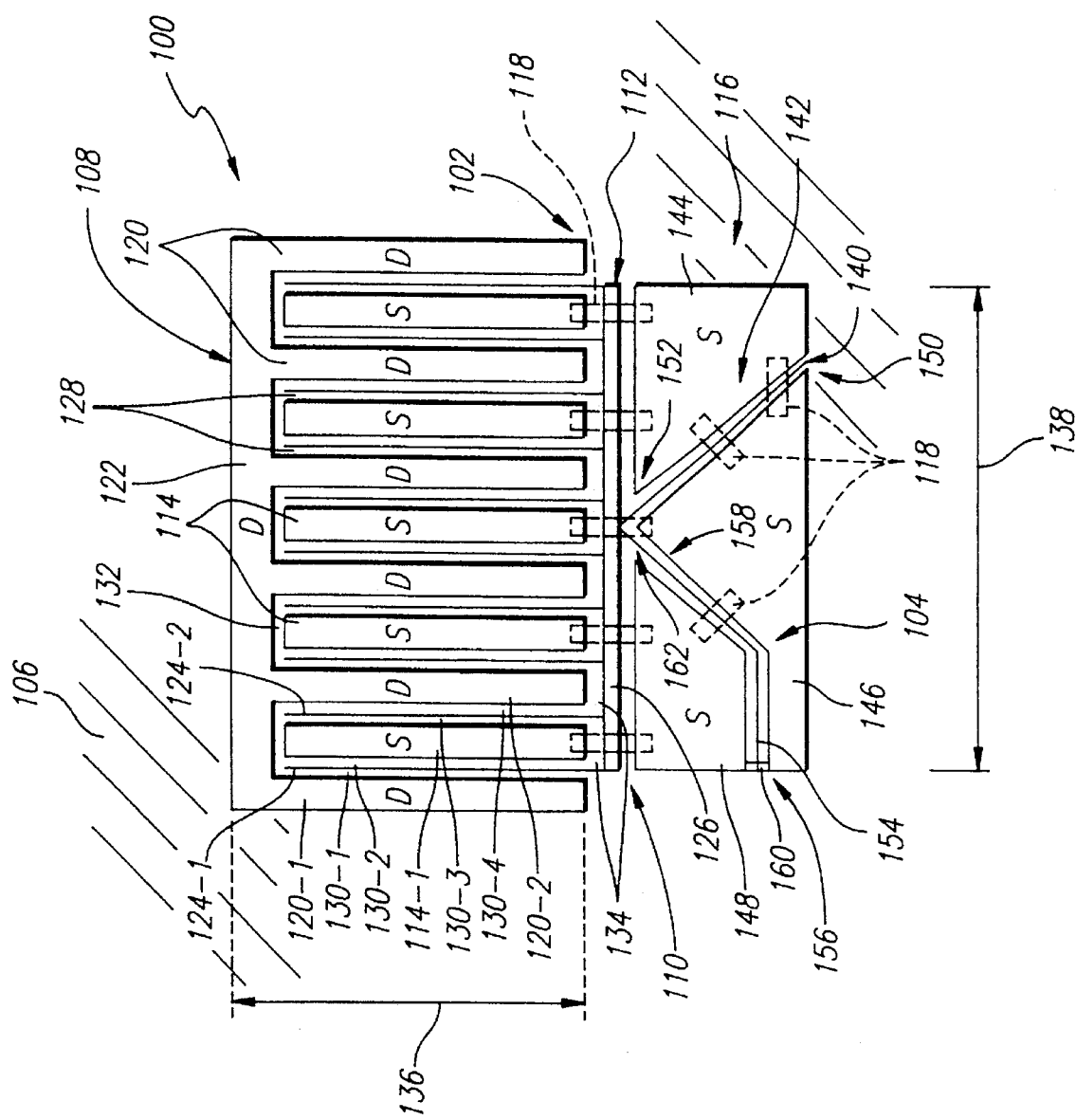
FIG. 3 is a top view of a prematched amplifier of the present invention including an active gain device and a matching element.

As illustrated in FIG. 3, a prematched amplifier 100 embodying principles of the present invention includes an active gain device 102 and matching or prematch element 104. The active gain device 102 preferably comprises a power MESFET as shown in FIG. 3. More particularly, FIG. 3 illustrates in solid lines the electrode layout in a first plane of the MESFET 102 which preferably comprises a MMIC device formed in a semiconductor substrate 106. The MESFET 102 includes a distributed drain electrode 108 (labelled "D"), a distributed source electrode 110 (labelled "S"), and a distributed gate electrode 112, formed on the surface of semiconductor substrate 106.

The source electrode 110 preferably comprises a plurality of source finger portions 114 and a plurality of source feed portions 116 disposed individually on the surface of substrate 106 and electrically connected by cross-over interconnect portions, or jumper leads 118 (indicated in dashed lines). The cross-over interconnect portions 118 are preferably formed in a second metal layer provided in a different plane of the MMIC structure of the MESFET 102 than the plane containing the source finger portions 114 and the source feed portions 116. The drain electrode 108 preferably comprises a plurality of drain finger portions 120 and a drain node portion 122 formed contiguously on the surface of substrate 106. Similarly, the gate electrode 112 preferably comprises a plurality of relatively thin gate finger portions 124 and a gate feed portion 126 formed contiguously on the surface of substrate 106.

The drain electrode 108 preferably comprises a comb-like shape in which the drain node portion 122 corresponds to the handle or shank of the comb-like shape and in which the drain finger portions 120 correspond to the teeth of the comb-like shape. The drain finger portions 120 are preferably rectangular in shape and spaced at a predetermined distance from each other. The drain finger portions 120 emerge from the drain node portion 122 running in a first direction.

The source finger portion 114 is preferably disposed symmetrically in the space between each pair of adjacent drain finger portions 120. The source finger portions 114 are also preferably rectangular in shape and spaced at a predetermined distance from each other. The width of each source finger portion 114 is preferably narrower than the predetermined distance between the drain finger portions 120. Hence, a substantially rectangular region 128 is provided between each side of a respective source finger portion 114 and the corresponding adjacent drain finger portion 120.

The gate electrode 112 also preferably comprises a comb-like shape in which the gate feed portion 126 corresponds to the handle or shank of the comb-like shape and in which the gate finger portions 124 correspond to the teeth of the comb-like shape. The gate finger portions 124 are preferably rectangular in shape and spaced at a predetermined distance from each other. The gate finger portions 124 emerge from the gate feed portion 126 running in a second direction which is opposite to the first direction of the drain finger portions 120.

A gate finger portion 124 is preferably disposed symmetrically in the region 128 between each drain finger portion 120 and the corresponding adjacent source finger portion 114. The width of each gate finger portion 124 is preferably narrower than the region 128 between each drain finger portion 120 and the corresponding adjacent source finger portion 114.

The foregoing arrangement results in the electrode layout shown at the top of FIG. 3 for a preferred MESFET 102 including five (5) source fingers 124, six (6) drain fingers 120, and ten (10) gate fingers 124. From left to right of FIG.

3, the MESFET 102 comprises the width of a first drain finger 120-1, a first dielectric region 130-1, the width of a first gate finger 124-1, a second dielectric region 130-2, the width of a first source finger 114-1, a third dielectric region 130-3, the width of a second gate finger 124-2, a fourth dielectric region 130-4, and the width of a second drain finger 120-2. The foregoing pattern repeats five (5) times in the illustrated preferred embodiment, each time beginning and ending on consecutive drain fingers 120.

FIG. 3, from top to bottom, illustrates that the MESFET 102 also includes the drain node portion 122 integrally provided at the top ends of the length of each drain finger portion 120, a dielectric region 132 between the end of each source finger portion 114 and the drain node portion 122, a dielectric region 134 adjacent to the bottom ends of the respective drain and source fingers 114, 120, and the gate feed portion 126 integrally provided at the bottom ends of the length of each gate finger portion 124.

The drain electrode 108, the source electrode 110 and the gate electrode 112 all preferably comprise gold, a gold compound or similar conductive material. The substrate 106 preferably comprises gallium arsenide (GaAs) semiconductor material having active drain and source regions (not shown) provided therein below the source finger portions 114 and the drain finger portions 120, respectively. The source finger portions 114 and the drain finger portions 120 preferably provide an ohmic, or non-rectifying electrical contact with the respective underlying active source and drain regions (not shown) in substrate 106. The gate finger portions 124 preferably provide a rectifying electrical contact with the underlying active channel regions (not shown) disposed in the substrate 106. The source, gate and drain electrodes are provided in a coplanar arrangement suitable for acting as a waveguide over a range of operating frequencies.

A width 136 of the MESFET 102 is substantially equivalent to the length of each one of the plurality of source finger portions 114. The width 136 is adaptable to various values depending on the design criteria of the amplifier 100. The width 136 preferably is provided in the range of fifty micrometers (50 μm) to two hundred micrometers (200 μm). A length 138 of the MESFET 102 is adaptable to various values by providing more or fewer gate, drain and source fingers in the overall device structure. For example, a MESFET 102 can be provided having a number "n" of source fingers 114, a number "2n" of gate fingers 124 and a number "n+1" of drain fingers 120 contributing to the overall device length 138, as described above for the case where n=5.

For relatively high power applications the number "n" of source fingers 114 provided in MESFET 102 is increased accordingly, providing a corresponding increase in the number of gate and drain fingers. The length 138 of the MESFET 102 increases as the number "n" is increased and decreases as the number "n" is decreased. Preferably, the length 138 of MESFET 102 is increased to provide the amplifier 100 with increased power handling capabilities. Preferably, the length 138 of MESFET 102 is provided in the range between one-quarter micrometer (0.25 μm) and one micrometer (1 μm).

The amplifier 100 is designed with an appropriate power capability for the application at hand and is prematched to a particular input source (not shown) at a given operating frequency or center frequency using a predetermined value for the matching element 104. The input signal is applied to an input waveguide 142 which preferably comprises a coplanar waveguide, or symmetrical surface stripline provided between a first source feed electrode 144 and a second source feed electrode 146. The input waveguide 142 includes an input electrode 140 disposed in a slot formed between the first source feed electrode 144 and the second source feed electrode 146. The input waveguide 142 includes a first end, or input end 150, and a second end, or signal feed end 152. The first end 150 is disposed at an outer edge of the source feed electrodes 144, 146. The input signal from a signal source (not shown) is applied at the first end 150 of the waveguide 142 across the input electrode 140 and one of the source feed electrodes 144 or 146.

The matching element, or tuned transmission line 104 preferably comprises a second coplanar waveguide, or second symmetrical surface stripline provided between the second source feed electrode 146 and a third source feed electrode 148. The tuned transmission line 104 preferably includes a center electrode 154 disposed in a slot formed between the second source feed electrode 146 and the third source feed electrode 148. The tuned transmission line 104 includes a first end, or input end 158, and a second end, or termination end 156. The termination end 156 is disposed at an outer edge of the source feed electrodes 146, 148. The input signal from a signal source (not shown) is applied at the center electrode 154 of the coplanar transmission line 104 where it couples to the gate feed electrode 126 and to the second end 152 of the input waveguide 142. The center electrode 154, input electrode 140 and gate feed portion 126 preferably comprise a single electrical node and are coupled to each other in an input signal feed region 162.

The gate feed electrode 126 has a length that depends on the number of gate fingers 124 provided in the MESFET 102. The gate feed electrode 126 preferably extends symmetrically in opposing directions from the signal feed region 162 which is preferably centered along the length 138 of the MESFET 102. The source feed electrodes 144, 146, 148 are preferably disposed along the width of the gate feed electrode 126, on an opposing side thereof from the gate fingers 124, source fingers 114, and drain fingers 120. The cross-over electrical interconnects 118 are preferably disposed in a plane above that of the gate feed electrode 126. The cross-over electrical interconnects 118 serve to couple the source fingers 114 to the source feed electrodes 144, 146, 148. The interconnects 118 also serve to couple the source feed electrodes 144, 146, 148 to each other.

The input waveguide 142 is preferably disposed substantially at a forty-five (45) degree angle with respect to the axis of the gate feed electrode 126. The tuned transmission line 104 is preferably disposed at a forty-five (45) degree angle with respect to the axis of the gate feed electrode 126. Near the signal feed region 162, the tuned transmission line 104 and the input waveguide 142 are preferably disposed orthogonally at a ninety (90) degree angle with respect to each other. The foregoing arrangement minimizes the occurrence of undesired electromagnetic coupling between the input waveguide 142, the tuned transmission line 104 and the MESFET 102.

The above-described amplifier 100 advantageously provides a coplanar waveguide structure for each of the input waveguide 142, the MESFET 102, and the matching element, or tuned transmission line 104. A coplanar structure reduces undesired electromagnetic coupling of the various components of the amplifier 100. The use of the cross-over interconnects 118 in a metal layer above the substrate 106 eliminates the need to provide holes in the substrate as commonly found in prior art microstrip style amplifier configurations.

Figure 4:
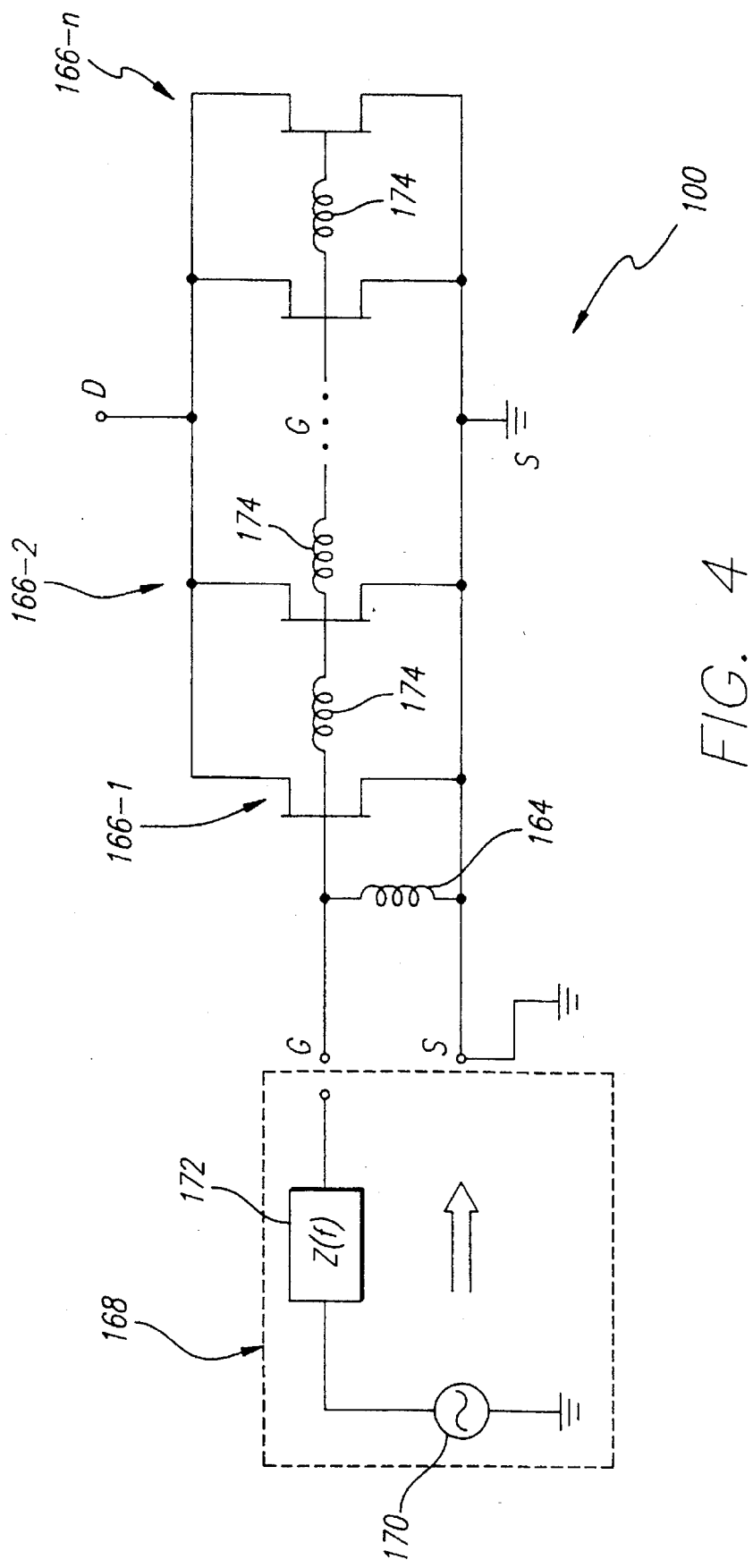
FIG. 4 shows a high frequency equivalent circuit model of the prematched amplifier of FIG. 3.

The MESFET 102 in combination with the matching element 104 provide a microwave (RF) range amplifier 100 which is easily matched to a predetermined signal source operated at a predetermined center frequency. As illustrated in FIG. 4, the present invention has a simplified high frequency equivalent circuit due to the close spacial relationship between the tuned transmission line 104 and the and the signal feed region 162. In particular, the matching element 104 is accurately modelled by an inductor 164 coupled across the gate and source terminals at the input of a first distributed-model stage 166-1 of the amplifier 100. The inductance of inductor 164 is "seen" directly by an input signal source 168 which includes a voltage source 170, without being transformed successively by each distributed active stage 166 of the high frequency model of MESFET 102. Therefore, the predetermined finite size of either the matching element 104 or the MESFET 102 does not effect the accuracy of the model of the other element in the high frequency equivalent model. Accordingly, the driving point impedances of the matching element 104 and the MESFET 102 can be characterized separately over a range of sizes, geometries, and/or frequencies.

The matching element, or tuned transmission line 104 is preferably terminated in a short circuit 160 (FIG. 3) giving it a finite length and a corresponding predetermined impedance value at the operating frequency. Preferably, the length of the tuned transmission line 104 is less than one-quarter of the wavelength of the signal received from the input signal source 168. A short-circuit terminated transmission line 104 with a length less than one-quarter of the signal wavelength acts as an inductor. However, the transmission line 104 can also be tuned to a desired impedance value in other ways. For example, an open circuited transmission line can be tuned to act as an inductor at a given operating frequency.

The independent characterization of the MESFET 102 and of the matching element 104 greatly simplifies the design of a prematched amplifier 100 as follows. Various size MESFETS 102, providing various power handling capacities, are characterized over a range of relatively high center frequencies. Similarly, various lengths for matching element 104 are characterized over a range of relatively high center frequencies. Accordingly, a plurality of precharacterized matching elements 104 (values for inductor 164) and a plurality of precharacterized MESFETs 102 are provided. A precharacterized MESFET 102 is chosen having a size corresponding to the power requirements of the amplifier 100. Thereafter, a precharacterized matching element 104 is selected to match the MESFET 102 to the relevant parameters of input signal source 168.

For example, suppose a multi-watt amplifier 100 is to be designed to operate from the input signal source 168 oscillating in the x-band of the RF spectrum and having a series impedance element 172 designated Z(f) of fifty (50) ohms. The predetermined width 136 and length 138 of the MESFET 102 are chosen based on the power requirements of the amplifier 100. For a multi-watt (high power) amplifier 100, the MESFET 102 is provided with a relatively large number "n" of gate fingers 124, corresponding to a relatively large length 138. However, such a high power MESFET 102 usually exhibits an input impedance much lower than fifty (50) ohms at the x-band operating frequency. Since the MESFET 102 has been pre-characterized over a range of RF frequencies, its characteristics in the x-band of operation are known. Also, various lengths of tuned transmission line 104 have been pre-characterized so that a particular length for the transmission line 104 is known to correspond to a particular inductance value for inductor 164 while operating in the x-band of the RF frequency. The designer simply chooses an appropriate inductance value for inductor 164 in order to match the pre-characterized MESFET 102 to the input signal source 168 thereby providing a prematched amplifier 100 at the x-band frequency of operation.

If it is desired to change the frequency of operation from x-band to a different RF frequency band, such as C-band, the designer simply selects a different pre-characterized inductance value for inductor 164 and specifies the corresponding length of tuned transmission line 104 in order to provide the properly prematched amplifier 100. The design combination of a pre-characterized tuned transmission line 104 with a pre-characterized MESFET 102 having a particular power capability does not require re-characterization for changes in amplifier frequency or amplifier element sizes.

As discussed supra with respect to a preferred embodiment, FIG. 4 shows the parallel inductor 164 coupled at the input stage of a distributed parameter MESFET 102 by providing the tuned coplanar transmission line 104 with the short circuit termination 160. The length of the tuned transmission line 104 is preferably less than one-quarter of the input signal wavelength thereby providing an inductive impedance value at the predetermined operating frequency. The tuned transmission line 104 is placed in relatively close spacial relationship with the input signal waveguide 142 so that the inductor 164 is coupled in parallel at the input stage of the high frequency equivalent model rather than across the output stage of the high frequency equivalent model for the MESFET 102. The inductor 164 raises the RF impedance of the amplifier 100 to facilitate wide bandwidth high power microwave signal amplification. The close spacing of the matching element 104 with the input signal feed region 162 of MESFET 102 eliminates frequency scaling uncertainty caused by the distributed effects of the MESFET 102 as exhibited in prior art high power microwave amplifiers.

In summary, the present invention greatly improves the frequency scalability of pre-matched high power microwave transistor amplifiers in monolithic microwave integrated circuits. The frequency band of amplifier operation can be changed by simply changing the impedance value of the matching element 104 without the need to re-characterize the overall amplifier 100. Conventional prematched amplifiers need to be re-characterized each time the matching element is changed.

The present invention shortens the design cycle and improves the response time to new MMIC product needs by providing pre-matched amplifier building blocks that can easily be scaled for different frequency responses. Such a simplified building block system also significantly reduces the time to market for a particular microwave amplifier design. For example, the present invention can save several months of product development time and tens of thousands of dollars in engineering expenditure.

In conclusion, it is to be understood that the foregoing detailed description and the accompanying drawings illustrate the principals of the invention. However, various changes and modifications may be employed without departing from the spirit and scope of the invention. Thus, by way of example and not of limitation, the prematching technique of the present invention is applicable in integrated circuits other than those specifically discussed. For example, the prematching technique may be employed with flip chips. Accordingly, the present invention is not limited to the specific form shown in the drawings and described in detail hereinabove.

What is claimed is:

1. A frequency scalable pre-matched amplifier comprising:

an active gain device comprising a transistor including an input electrode comprising a gate feed electrode for receiving an input signal with a predetermined center frequency and at least one source finger portion; and a matching element including an input end and a termination said input end being electrically coupled to said input electrode providing a signal feed region, said termination being at a predetermined distance from said signal feed region, said predetermined distance being selected to optimize a power transfer of the input signal at said signal feed region, and a plurality of source feed portions electrically connected to said at least one source finger portion providing a distributed source electrode wherein said plurality of source feed portions provide an input waveguide for receiving the input signal and a termination waveguide between said signal feed region and said termination wherein said input waveguide is disposed substantially orthogonally to said termination waveguide.

2. The amplifier of claim 1 wherein said signal feed region is substantially centered along a length of said gate feed electrode.

3. The amplifier of claim 1 further comprising:

a plurality of electrical interconnects for coupling said at least one source finger portion to said plurality of source feed portions.

4. The amplifier of claim 1 wherein said waveguides are coplanar waveguides.

5. The amplifier of claim 1 wherein said waveguides are symmetrical surface stripline.

6. The amplifier of claim 1 wherein said input waveguide is disposed substantially at a forty-five degree angle with respect to an axis of said gate feed electrode and said termination waveguide is disposed substantially at a forty-five degree angle with respect to said axis.

7. A frequency scalable pre-matched amplifier comprising:

an active gain device electronically connected to a first coplanar waveguide for receiving an input signal with a predetermined center frequency from a signal source, the first coplanar waveguide including a signal input end and a signal feed end; and a matching element comprising a second coplanar waveguide disposed substantially orthogonally to said first coplanar waveguide and including a first end and a second end, said second coplanar waveguide being coupled at said first end thereof to said signal feed end of said first coplanar waveguide providing a signal feed region, said second end including a termination at a predetermined distance from said signal feed region, said predetermined distance being selected to optimize a power transfer of the input signal at said signal feed region.

8. The amplifier of claim 7 wherein said active gain device comprises a MESFET.

9. The amplifier of claim 7 wherein said termination comprises a short circuit.

10. The amplifier of claim 7 wherein said active gain device comprises:

a distributed source electrode;

a distributed drain electrode; and a distributed gate electrode coupled to said signal feed region.

11. The amplifier of claim 10 wherein said distributed gate electrode includes a gate feed portion coupled to said signal feed region.

12. The amplifier of claim 11 wherein said gate feed portion is disposed substantially at a forty-five degree angle to said first coplanar waveguide.

13. The amplifier of claim 11 wherein said gate feed portion is disposed substantially at a forty-five degree angle to said second coplanar waveguide.

* * * * *